United States Patent
Jeon et al.

(10) Patent No.: US 10,319,427 B2
(45) Date of Patent: Jun. 11, 2019

(54) SEMICONDUCTOR DEVICE

(71) Applicant: SAMSUNG ELECTRONICS CO., LTD., Suwon-si, Gyeonggi-Do OT (KR)

(72) Inventors: Chang Hoon Jeon, Goyang-si (KR); Yong Seok Kim, Suwon-si (KR); Jun Hee Lim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 6 days.

(21) Appl. No.: 15/794,628

(22) Filed: Oct. 26, 2017

(65) Prior Publication Data

US 2018/0358079 A1    Dec. 13, 2018

(30) Foreign Application Priority Data

Jun. 9, 2017   (KR) .................. 10-2017-0072344

(51) Int. Cl.
*G11C 11/34* (2006.01)
*G11C 11/40* (2006.01)

(52) U.S. Cl.
CPC .................... *G11C 11/40* (2013.01)

(58) Field of Classification Search
CPC .................................................. G11C 11/40
USPC ............................ 365/185.01, 185.05, 182
See application file for complete search history.

(56) References Cited

U.S. PATENT DOCUMENTS

| | | | |
|---|---|---|---|
| 8,106,455 B2 | 1/2012 | Greene et al. | |
| 8,912,607 B2 | 12/2014 | Kwon et al. | |
| 9,330,981 B2 | 5/2016 | Maeda et al. | |
| 9,431,413 B2 | 8/2016 | Chuang et al. | |
| 9,536,992 B2 | 1/2017 | Van Bentum et al. | |
| 9,693,213 B2* | 6/2017 | Self | H04W 4/90 |
| 2002/0028555 A1 | 3/2002 | Boyd et al. | |
| 2005/0287759 A1* | 12/2005 | Wang | H01L 21/823412 438/400 |
| 2006/0017115 A1* | 1/2006 | Tu | H01L 27/10861 257/371 |
| 2006/0131672 A1* | 6/2006 | Wang | H01L 21/28202 257/410 |
| 2008/0048243 A1* | 2/2008 | Morikado | H01L 27/115 257/316 |
| 2009/0108356 A1 | 4/2009 | Cheng et al. | |
| 2010/0052021 A1* | 3/2010 | Mocho | H01L 27/11509 257/295 |
| 2010/0065898 A1* | 3/2010 | Choi | H01L 27/10894 257/296 |

(Continued)

*Primary Examiner* — Viet Q Nguyen

(74) *Attorney, Agent, or Firm* — F. Chau & Associates, LLC

(57) ABSTRACT

A semiconductor device includes a memory cell region including memory cells arranged along channel holes, the channel holes being provided on a substrate to extend in a direction perpendicular to an upper surface of the substrate, and a peripheral circuit region disposed outside of the memory cell region and including low voltage transistors and high voltage transistors. The low voltage transistors include first transistors including a first gate dielectric layer and a first gate electrode layer including a metal, and the high voltage transistors include second transistors including a second gate dielectric layer having a dielectric constant lower than a dielectric constant of the first gate dielectric layer, and a second gate electrode layer including polysilicon.

19 Claims, 18 Drawing Sheets

(56) References Cited

U.S. PATENT DOCUMENTS

| | | | |
|---|---|---|---|
| 2010/0105198 A1* | 4/2010 | Lee | H01L 27/11568 |
| | | | 438/586 |
| 2012/0292708 A1 | 11/2012 | Chen et al. | |
| 2013/0049091 A1* | 2/2013 | Saino | H01L 21/823842 |
| | | | 257/310 |
| 2013/0193521 A1* | 8/2013 | Lee | G11C 11/412 |
| | | | 257/369 |
| 2013/0228843 A1 | 9/2013 | Lim et al. | |
| 2015/0001602 A1* | 1/2015 | Wu | H01L 27/10885 |
| | | | 257/296 |
| 2015/0243331 A1* | 8/2015 | Zhang | G11C 5/145 |
| | | | 365/51 |
| 2016/0027821 A1* | 1/2016 | Ahn | H01L 27/1463 |
| | | | 257/446 |
| 2016/0056191 A1* | 2/2016 | Liu | H01L 27/14612 |
| | | | 257/291 |
| 2016/0056250 A1 | 2/2016 | Chuang et al. | |
| 2016/0099181 A1* | 4/2016 | Tung | H01L 21/823821 |
| | | | 257/369 |
| 2016/0181107 A1* | 6/2016 | Shin | H01L 27/11534 |
| | | | 438/592 |
| 2016/0204219 A1 | 7/2016 | Schloesser et al. | |

* cited by examiner

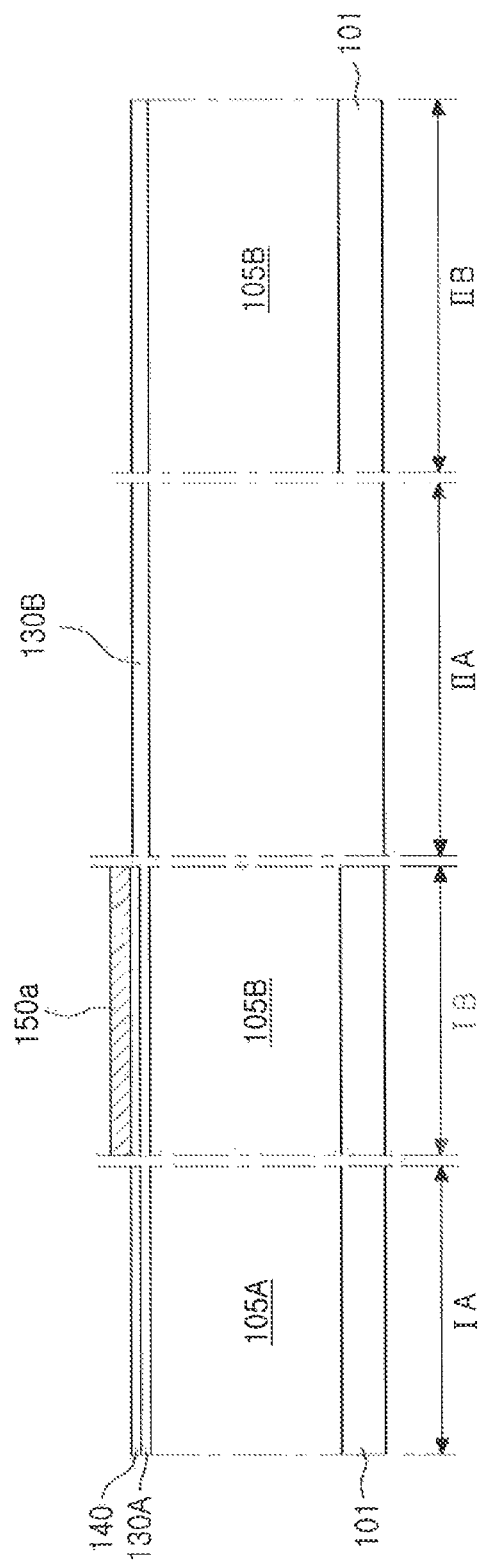

SEMICONDUCTOR DEVICE

CROSS-REFERENCE TO RELATED APPLICATION(S)

This application claims priority under 35 U.S.C. § 119(a) to Korean Patent Application No. 10-2017-0072344 filed on Jun. 9, 2017 in the Korean Intellectual Property Office, the disclosure of which is incorporated by reference herein in its entirety.

BACKGROUND

1. Field

The present inventive concept relates to a semiconductor device.

2. Description of Related Art

As the demand for high performance, high speed, and multi-function in electronic devices increases, integration density of semiconductor devices in electronic devices is increasing. According to the increased integration density of semiconductor devices, the scaling of transistors becomes critically important.

SUMMARY

An aspect of the present inventive concept is to provide a semiconductor device having increased integration and secured reliability.

According to an aspect of the present inventive concept, a semiconductor device includes a memory cell region including memory cells arranged along channel holes, the channel holes being provided on a substrate to extend in a direction perpendicular to an upper surface of the substrate, and a peripheral circuit region disposed outside of the memory cell region and including low voltage transistors and high voltage transistors. The low voltage transistors include first transistors including a first gate dielectric layer and a first gate electrode layer including a metal, and the high voltage transistors include second transistors including a second gate dielectric layer having a dielectric constant lower than a dielectric constant of the first gate dielectric layer, and a second gate electrode layer including polysilicon.

According to an aspect of the present inventive concept, a semiconductor device includes a memory cell region including memory cells arranged along channel holes, the channel holes being provided on a substrate to extend in a direction perpendicular to an upper surface of the substrate, and a peripheral circuit region disposed outside of the memory cell region, and including first transistors generating an electrical signal required for operations of the memory cells and second transistors generating an electrical signal required for communications between the memory cells and an external host. The first transistors include a first gate dielectric layer, and the second transistors include a second gate dielectric layer having a dielectric constant lower than a dielectric constant of the first gate dielectric layer.

According to an aspect of the present inventive concept, a semiconductor device includes a memory cell region including memory cells including a charge storage layer, and a peripheral circuit region disposed outside of the memory cell region and including first transistors including a first gate dielectric layer including a high-k material and a first gate electrode layer including a metal, and second transistors including a second gate dielectric layer including silicon dioxide ($SiO_2$) and a second gate electrode layer including polysilicon.

BRIEF DESCRIPTION ON OF DRAWINGS

The above and other aspects, features, and advantages of the present disclosure will be more clearly understood from the following detailed description when taken in conjunction with the accompanying drawings, in which:

FIGS. 8A to 8H are schematic cross-sectional views illustrating a method of manufacturing a semiconductor device according to example embodiments;

DETAILED DESCRIPTION

Hereinafter, example embodiments of the present inventive concept will be described with reference to the accompanying drawings.

Figure 1:
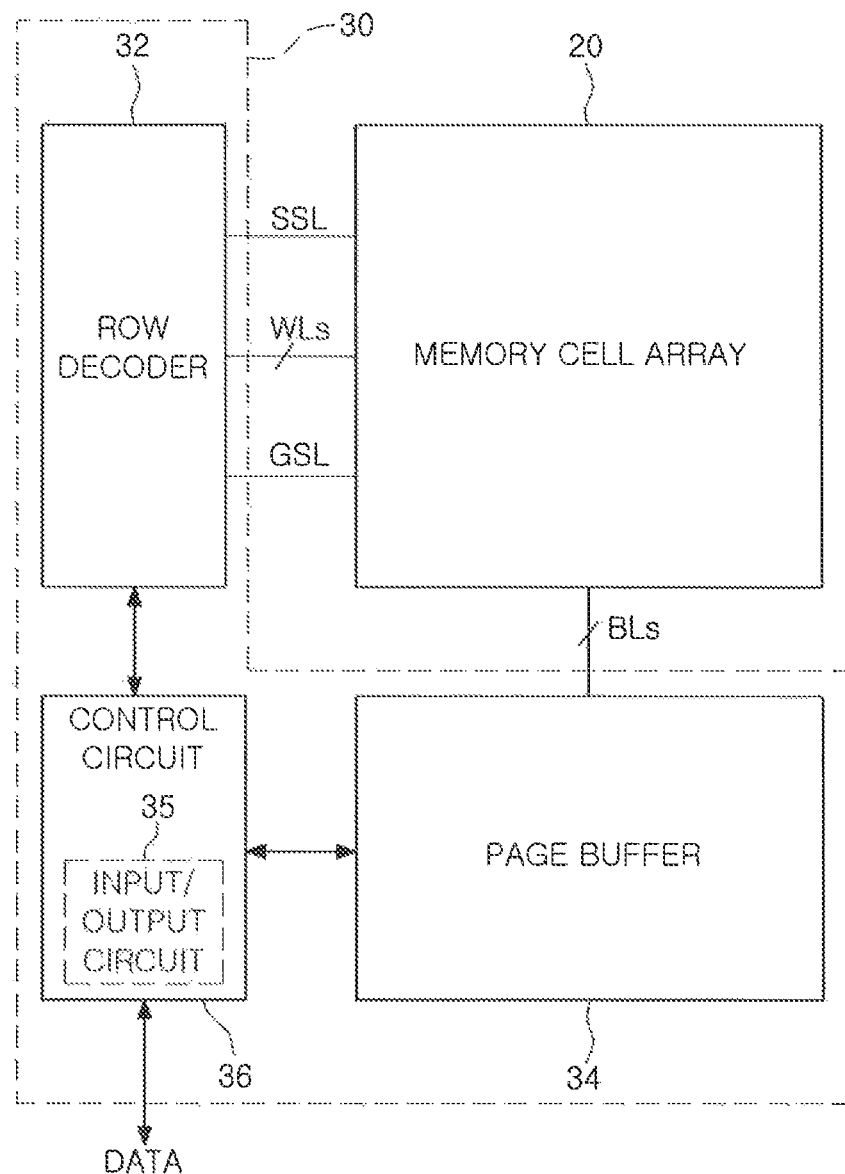
FIG. 1 is a schematic block diagram of a semiconductor device according to example embodiments.

FIG. 1 is a schematic block diagram of a semiconductor device according to example embodiments.

With reference to FIG. 1, a semiconductor device 10 according to an example embodiment may include a memory cell array 20 and a control logic 30.

The memory cell array 20 may include a plurality of memory blocks, and each of the memory blocks may include a plurality of memory cells. The plurality of memory cells may be connected to a row decoder 32 via a string select line SSL, a plurality of word lines WLs and a ground select line GSL, and may be connected to a page buffer 34 via bit lines BLs. In example embodiments, a plurality of memory cells arranged linearly in a single row may be connected to the same word line WL, and a plurality of memory cells arranged linearly in a single column may be connected to the same bit line BL.

The control logic 30 may include the row decoder 32, the page buffer 34, and a control circuit 36.

The row decoder 32 may decode an input address to generate and transmit driving signals of the word line WL. The row decoder 32 may provide word line voltages generated from a voltage generating circuit in the control circuit 36 in response to control of the control circuit 36, to a selected word line WL and unselected word lines WLs respectively.

The page buffer 34 may be connected to the memory cell array 20 via bit lines BLs to read information stored in the memory cells. The page buffer 34 may temporarily store data to be stored in the memory cells or may sense data stored in the memory cells, according to an operation mode. The page buffer 34 may include a column decoder and a sense amplifier. The column decoder may selectively connect the bit lines BLs to corresponding memory cells included in the memory cell array 20, and the sense amplifier may sense a voltage of the bit line BL selected by the column decoder during a reading operation to store the read data in the selected memory cell.

The control circuit 36 may control operations of the row decoder 32 and the page buffer 34. The control circuit 36 may receive an externally transmitted control signal and an external voltage, and may operate according to the received control signal. The control circuit 36 may include a voltage generating circuit generating voltages required for internal operations, for example, a program voltage, a read voltage, an erase voltage, and the like, using an external voltage. The control circuit 36 may control read, write, and/or erase operations in response to the control signals.

The control circuit 36 may include an input/output circuit 35. The input/output circuit 35 may be internally connected to the page buffer 34, and may be externally connected to a host, to receive and output data DATA. The input/output circuit 35 may receive the data DATA to transfer the data to the page buffer 34 in a program operation, and may externally output the data DATA received from the page buffer 34 in a reading operation.

Figure 2:
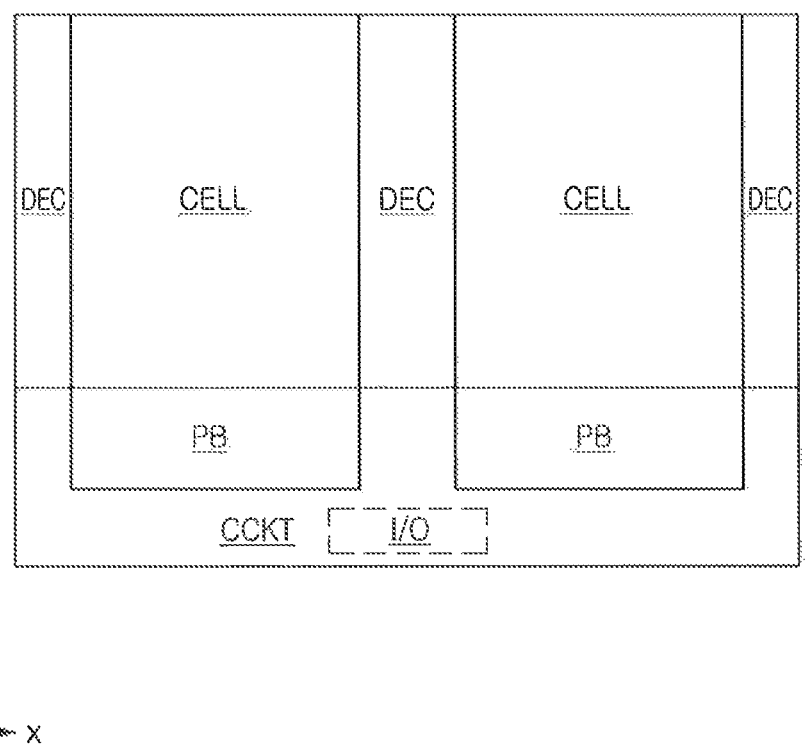
FIG. 2 is a schematic layout diagram of a semiconductor device according to example embodiments.

FIG. 2 is a schematic layout diagram of a semiconductor device according to example embodiments.

Referring to FIG. 2, the semiconductor device 10 may include a memory cell region CELL, and a row decoder region DEC, a page buffer region PB, and control circuit regions CCKT, which form a peripheral circuit region.

The memory cell region CELL may be a region in which the memory cell array 20 described above with reference to FIG. 1 is disposed. The row decoder region DEC may be a region in which the row decoder 32 of FIG. 1 is disposed. The page buffer region PB may be a region in which the page buffer 34 of FIG. 1 is disposed. The control circuit regions CCKT may be regions in which control circuits of FIG. 1 are disposed.

The row decoder region DEC may be disposed on at least one side of the memory cell region CELL in one direction thereof, for example, in an x direction. The buffer region PB may be disposed on at least one side of the memory cell region CELL in one direction, for example, in a y direction. Thus, the word lines WLs (see FIG. 1) may extend in the x direction from the memory cell region CELL toward the row decoder region DEC, and the bit lines BLs (see FIG. 1) may extend in the y direction from the memory cell region CELL toward the page buffer region PB.

The control circuit region CCKT may be disposed in the vicinity of the page buffer region PB, and the input/output circuit (I/O), a high voltage generating circuit, and the like may be disposed in the control circuit region CCKT. The input/output circuit (I/O) may be disposed in a lower end portion of the semiconductor device 10 to be externally connected via an input/output bus.

In the case of the semiconductor device 10 according to example embodiments, each of the regions may include high voltage transistors and low voltage transistors. For example, the high voltage transistors may include transistors generating electrical signals required for operations of memory cells, and the low voltage transistors may include transistors generating electrical signals required for communications between the memory cells and an external host.

For example, the row decoder region DEC may include high voltage transistors generating a program voltage Vpgm, a pass voltage Vpass, and the like during a program operation. The page buffer region PB may include high voltage transistors generating a read voltage Vread in a reading operation and generating an erase voltage Verase in an erase operation. In the control circuit region CCKT, the input/output circuit I/O may include low voltage transistors generating signals required for data input and output. In this case, the low voltage transistors may require high speed operations, and thus, may have a structure different from the transistors including the high voltage transistors, which will be described in more detail below, with reference to FIGS. 3 and 4.

Figure 3:
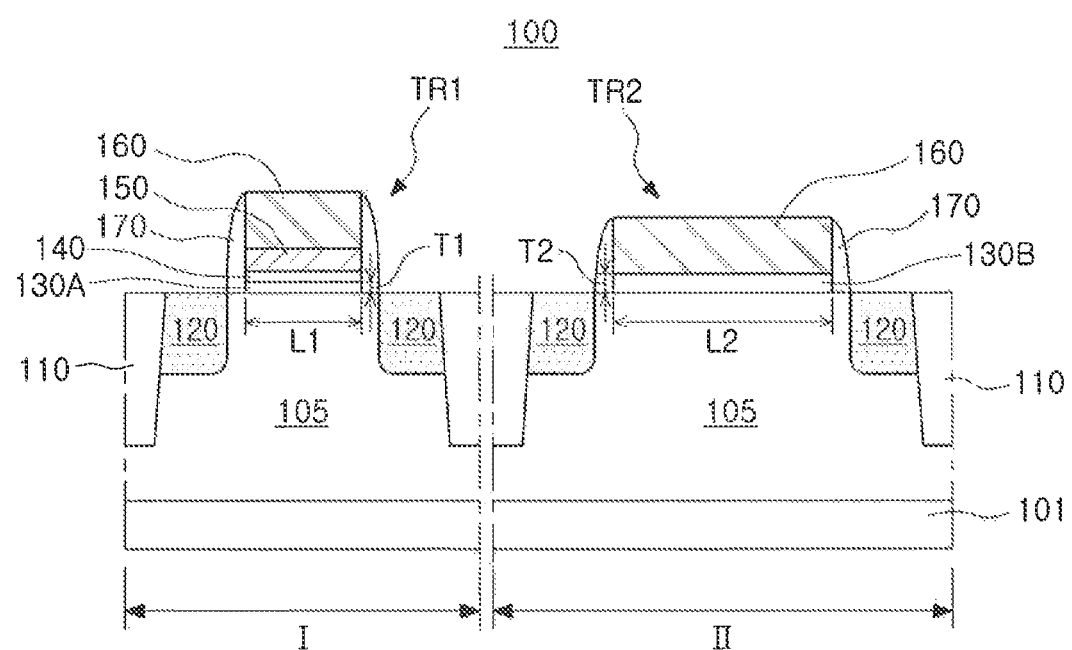
FIG. 3 is a schematic cross-sectional view of a semiconductor device according to example embodiments.

FIG. 3 is a schematic cross-sectional view of a semiconductor device according to example embodiments.

With reference to FIG. 3, a semiconductor device 100 may include first and second regions I and II, and may include a first transistor TR1 disposed in the first region I and a second transistor TR2 disposed in the second region II.

The first and second regions I and II may be regions adjacent to each other or regions spaced apart from each other. The first and second regions I and II may be at least portions of the peripheral circuit region described above with reference to FIG. 2. The first region I may be a region in which the low voltage transistor is disposed, and the second region H may be a region in which the high voltage transistor is disposed. Thus, the first transistor TR1 may be a low voltage transistor, the second transistor TR2 may be a high voltage transistor. An operation voltage of the first transistor TR1 may be lower than an operation voltage of the second transistor TR2. For example, the operating voltage of the first transistor TR1 may range from 1 V to 5 V, and the operating voltage of the second transistor TR2 may range from 10 V to 40 V. A channel length L1 of the first transistor TR1 may be shorter than a channel length L2 of the second transistor TR2. For example, the channel length L1 of the first transistor TR1 may be within a range of 100 nm to 500 nm, and the channel length L2 of the second transistor TR2 may be within a range of 600 nm to 2000 nm.

Well regions 105, device isolation regions 110 and source/drain regions 120 may be disposed in a substrate 101. Gate stacks may be disposed on the substrate 101.

The substrate 101 may include a semiconductor material, for example, a group IV semiconductor material, a group III-V compound semiconductor material, or a group II-VI oxide semiconductor material. For example, an example of the group IV semiconductor material may include silicon, germanium, or silicon-germanium. The substrate 101 may be provided as a bulk water, an epitaxial layer, a silicon-on-insulator (SOI) layer, a semiconductor-on-insulator (SeOI) layer, or the like.

The well regions 105 may be defined in the substrate 101, and may include impurities of the same type as or of the different type from that of the substrate 101 and may have same concentration as or a different concentration from the concentration of the substrate. The impurities may be n-type impurities or p-type impurities, depending on, the type of the transistors TR1 and TR2.

The device isolation regions 110 may define an active region in the substrate 101. The device isolation regions 110 may be formed of an insulating material. The device isolation regions 110 may be formed of, for example, an oxide, a nitride, or a combination thereof. The device isolation regions 110 may be formed, for example, by a shallow trench isolation (STI) process.

The first transistor TR1 may include a first gate dielectric layer 140 and a second gate dielectric layer 130A, as gate dielectric layers, and further, may include a first gate electrode layer 150 and a second gate electrode layer 160, as gate electrode layers. The second gate dielectric layer 130A, the first gate dielectric layer 140, the first gate electrode layer 150 and the second gate electrode layer 160 may be sequentially stacked on the substrate 101, to form a gate stack of the first transistor TR1. The first transistor TR1 may further include spacers 170 and source/drain regions 120 disposed on both sides of the gate stack.

The second transistor TR2 may include a second gate dielectric layer 130B as a gate dielectric layer, and a second gate electrode layer 160 as a gate electrode layer. The second gate dielectric layer 130B and the second gate electrode layer 160 may be sequentially stacked on the substrate 101, to form a gate stack of the second transistor TR2. The second transistor TR2 may further include spacers 170 and source/drain regions 120 disposed on both sides of the gate stack.

The source/drain regions 120 may be disposed within the well regions 105 of the substrate 101, on both sides of the gate stacks. The source/drain regions 120 may be provided as source regions or drain regions of the first and second transistors TR1 and TR2. The source/drain regions 120 may include impurities of a different type from impurities of the well regions 105 adjacent thereto. In example embodiments, the source/drain regions 120 may include a plurality of regions containing different concentrations of impurities. In example embodiments, the source/drain regions 120 may also have an elevated source/drain structure in which a respective upper surface thereof is positioned to be higher than a bottom surface of the first gate electrode layer 150 or the second gate electrode layer 160.

The first gate dielectric layer 140 may include a high-k material. The high-k material may refer to a dielectric material having a dielectric constant higher than that of silicon dioxide ($SiO_2$). The high-k dielectric material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). The first gate dielectric layer 140 may have a thickness within a range of 5 Å to 100 Å. In example embodiments, the first gate dielectric layer 140 may further include a semiconductor or metal material doped to the high-k material, in addition to the high-k material. For example, the first gate dielectric layer 140 may include hafnium oxide ($HfO_2$) doped with silicon (Si) or lanthanum (La).

The second gate dielectric layers 130A and 130B may be formed of a material having a dielectric constant lower than that of the first gate dielectric layer 140. The second gate dielectric layers 130A and 130B may be an oxide layer, a nitride layer, or an oxynitride layer. For example, the second gate dielectric layers 130A and 130B may be termed of silicon dioxide ($SiO_2$).

The second gate dielectric layers 130A and 130B provided in the first and second transistors TR1 and TR2, respectively, may have different thicknesses. The second gate dielectric layer 130A in the first transistor TR1 may be disposed below the first gate dielectric layer 140, to have a first thickness T1. The first thickness T1 may be within a range, for example, of 5 Å to 100 Å. The second gate dielectric layer 130B in the second transistor TR2 may be disposed to have a second thickness T2 greater than the first thickness T1. The second thickness T2 may range, for example, from 200 Å to 800 Å. The second thickness T2 may be greater than a sum of thicknesses of the second gate dielectric layer 130A and the first gate dielectric layer 140 in the first transistor TR1.

The first transistor TR1 may include the second gate dielectric layer 130A provided between the substrate 101 and the first gate dielectric layer 140, to secure interface quality therebetween. In example embodiments, the first transistor TR1 may not include the second gate dielectric layer 130A, and in this case, the first gate dielectric layer 140 may be disposed to be in direct contact with the substrate 101.

The first gate electrode layer 150 may include a metal material. The first gate electrode layer 150 may include at least one of, for example, titanium (Ti), titanium nitride (TiN), tungsten (W), tungsten nitride (WN), titanium aluminum (TiAl), titanium aluminum nitride (TiAlN), tantalum (Ta), tantalum nitride (TaN), titanium carbide (TiC), tantalum carbide (TaC), tantalum carbonitride (TaCN), tantalum silicon nitride (TaSiN), cobalt (Co), ruthenium (Ru), copper (Cu), molybdenum (Mo), and aluminum (Al).

The second gate electrode layer 160 may include polysilicon. Thicknesses of the first gate electrode layer 150 and the second gate electrode layer 160 may be variously changed in example embodiments, and relative thicknesses thereof are not limited to those illustrated in the drawings. The first transistor TR1 may include the second gate electrode layer 160. On the other hand, according to example embodiments, the first transistor TR1 may not include the second gate electrode layer 160.

The spacers 170 may be disposed on sidewalls of the gate stacks. The 110 spacers 170 may insulate the source/drain regions 120 from the first and second gate electrode layers 150 and 160. The spacers 170 may be formed of an oxide, a nitride, and an oxynitride, and may be formed of a multilayer film. In example embodiments, the first and second transistors TR1 and TR2 may also include the spacers 170 having different structures.

As the first transistor TR1 includes the first gate dielectric layer 140 having high dielectric constant and the first gate electrode layer 150, high speed operation characteristics and reliability may be improved. Thus, at least a portion of low voltage transistors requiring high speed operations, among the transistor of the peripheral circuit region of the semiconductor device 100, may have the structure of the first transistor TR1. For example, at least a portion of the low voltage transistors constituting the input/output circuit 35 described above with reference to FIG. 1 may have the structure of the first transistor TR1. A structure of the second transistor TR2 may be applied to transistors generating a high voltage or transmitting a high voltage. As such, as different structures are applied to transistors in consideration of respective functions of the transistors, operation characteristics and reliability of the semiconductor device 100 may be secured.

Figure 4:
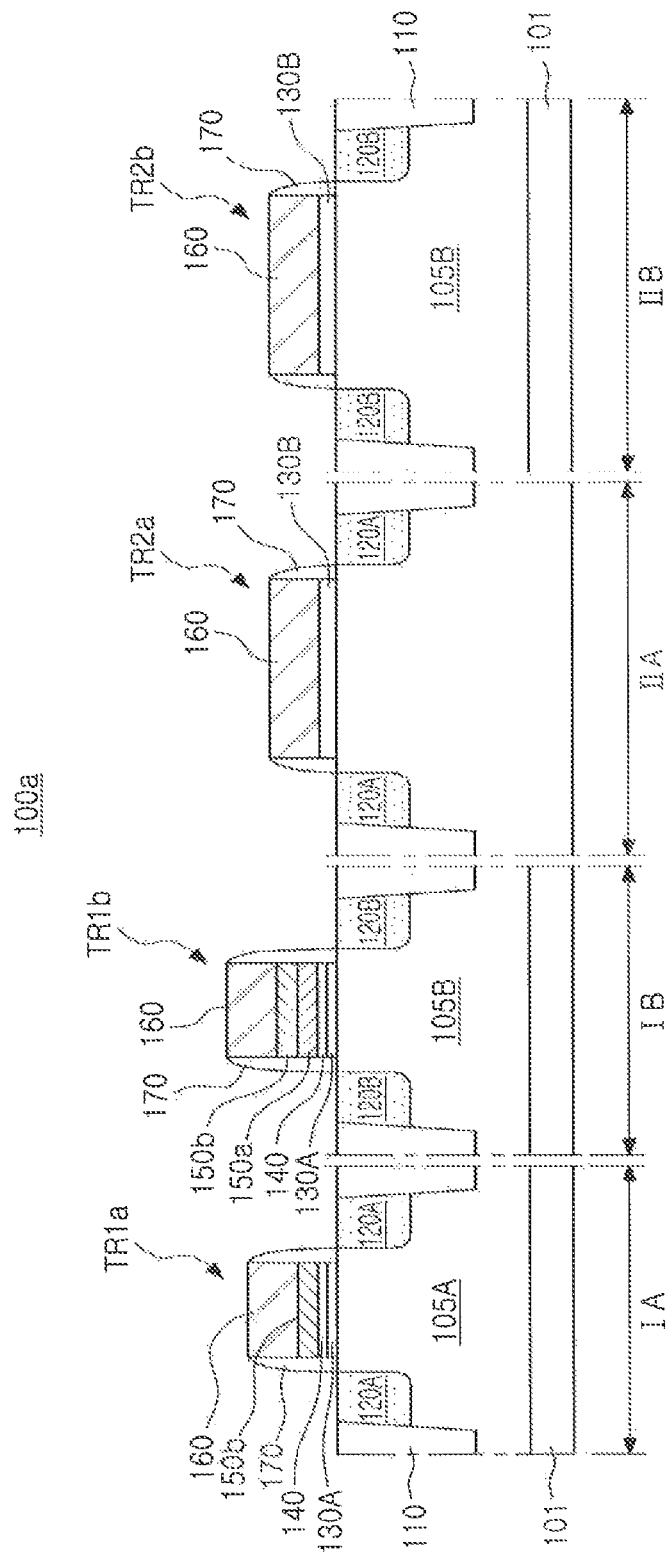
FIG. 4 is a schematic cross-sectional view of a semiconductor device according to example embodiments.

FIG. 4 is a schematic cross-sectional view of a semiconductor device according to example embodiments.

Referring to FIG. 4, a semiconductor device 100a may include first to fourth regions IA, IB, IIA and IIB. The semiconductor device 100a may include an n-type first transistor TR1a disposed in the first region IA, a p-type second transistor TR1b disposed in the second region IB, an n-type third transistor TR2a disposed in the third region IIA, and a p-type fourth transistor TR2b disposed in the fourth region IIB.

The first to fourth regions IA, IB, IIA and IIB may be regions adjacent to each other or regions spaced apart from each other. The first to fourth regions IA, IB, IIA and IIB may be at least portions of the peripheral circuit region described above with reference to FIG. 2. The first region IA and the second region IB may be regions in which low voltage transistors are disposed, and the third region IIA and the fourth region IIB may be regions in which high voltage transistor are disposed. The first and second transistors TR1*a* and TR1*b* may be n-type and p-type low voltage transistors, and the third and fourth transistors TR2*a* and TR2*b* may be n-type and p-type high voltage transistors, respectively.

The first and second well regions 105A and 105B may be defined in the substrate 101, and may include different types of impurities. The first well region 105A may include p-type impurities, and the second well regions 105B may include n-type impurities. The third region IIA may not include a separate well region, and in this case, the substrate 101 may function as a well region. In this case, the substrate 101 may include p-type impurities, and a concentration of the impurities may be lower than a concentration of the impurities of the first well region 105A.

The first and second source/drain regions 120A and 120B may be disposed in the first and second well regions 105A and 105B of the substrate 101, on both sides of the gate stacks. The first source/drain regions 120A may include n-type impurities, and the second source/drain regions 120B may include p-type impurities. In example embodiments, the first and second source/drain regions 120A and 120B of the first to fourth regions IA, IB, IIA and IIB may have different impurity concentrations.

The first transistor TR1*a* may include a first gate dielectric layer 140 and a second gate dielectric layer 130A, as gate dielectric layers, and a first metal layer 150*b* and a second gate electrode layer 160 as a gate electrode layer. The second gate dielectric layer 130A, the first gate dielectric layer 140, the first metal layer 150*b* and the second gate electrode layer 160 may be sequentially stacked on the substrate 101, to form a gate stack of the first transistor TR1*a*. The layers constituting the gate stack may be stacked to be in direct contact with each other in sequence. For example, the first gate dielectric layer 140 may be in direct contact with the first metal layer 150*b*. In FIG. 4, the same reference numerals as in FIG. 3 denote the same components, and thus, the same description may be applied to FIG. 4.

Although a gate stack of the second transistor TR2 is similar to the gate stack of the first transistor TR1, the second transistor TR2 may further include a second metal layer 150*a* below the first metal layer 150*b*, as a gate electrode layer. The second gate dielectric layer 130A, the first gate dielectric layer 140, the second metal layer 150*a*, the first metal layer 150*b* and the second gate electrode layer 160 may be sequentially stacked on the substrate 101, to firm the gate stack of the second transistor TR1*b*. The first gate dielectric layer 140 may be in direct contact with the second metal layer 150*a*.

In example embodiments, the first transistor TR1*a* may further include a second metal layer 150*a* as a gate electrode layer. For example, the first and second transistors TR1*a* and TR1*b* may include the first metal layer 150*b* and the second metal layer 150*a*, respectively, and further, may be changed to further include another metal layer. For example, when each of the first and second transistors TR1*a* and TR1*b* is provided as a plurality of transistors, gate electrode layers thereof may have different structures and/or thicknesses.

A work function of the second metal layer 150*a* may be higher than that of the first metal layer 150*b*. The first metal layer 150*b* may include an n-type metal, and the second metal layer 150*a* may include a p-type metal. For example, the n-type metal may be a metal having a work function of 4.3 eV or less, and the p-type metal may be a metal having a work function of 4.4 eV or more, but is not limited thereto. For example, the first metal layer 150*b* may be aluminum (Al), and the second metal layer 150*a* may be titanium nitride (TiN).

The third and fourth transistors TR2*a* and TR2*b* may include a second gate dielectric layer 130B as a gate dielectric layer, and the second gate electrode layer 160 as a gate electrode layer. The second gate dielectric layer 130B and the second gate electrode layer 160 may be sequentially stacked on the substrate 101, to form gate stacks of the third and fourth transistors TR2*a* and TR2*b*. The second gate dielectric layer 130B may be in direct contact with the second gate electrode layer 160.

Each of the first to fourth transistors TR1*a*, TR1*b*, TR2*a* and TR2*b* may further include spacers 170 and source/drain regions 120A and 120E disposed on both sides of the gate stack, respectively.

As the first and second transistors TR1*a* and TR1*b* include the first gate dielectric layer 140 of a high dielectric constant, and a gate electrode layer including the first and second metal layers 150*b* and 150*a*, even when the first and second transistors TR1*a* and TR1*b* have a relatively small size, leakage current may be reduced to increase reliability, and capacitance may be secured to obtain a high speed operation. Thus, among the transistors in the peripheral circuit region of the semiconductor device 100*a*, at least portions thereof, for example, low voltage n-type and p-type transistors requiring high speed operations, may have the structure of the first and second transistors TR1*a* and TR1*b*. For example, at least some low voltage transistors, including the low voltage transistors of the input/output circuit 35 (see FIG. 1) described above with reference to FIGS. 1 and 2, may have the structure of the first and second transistors TR1*a* and TR1*b*.

Figure 5:
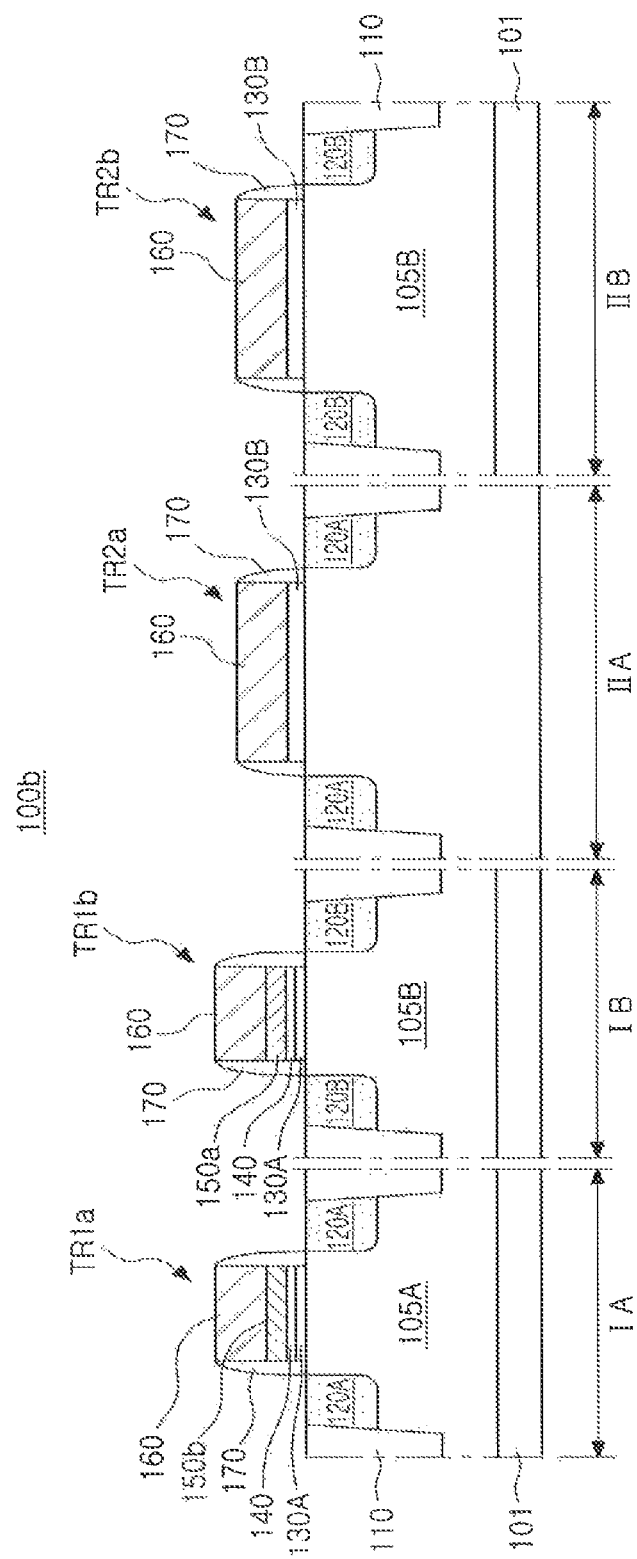
FIGS. 5 to 7 are schematic cross-sectional views of a semiconductor device according to example embodiments.
Figure 6:
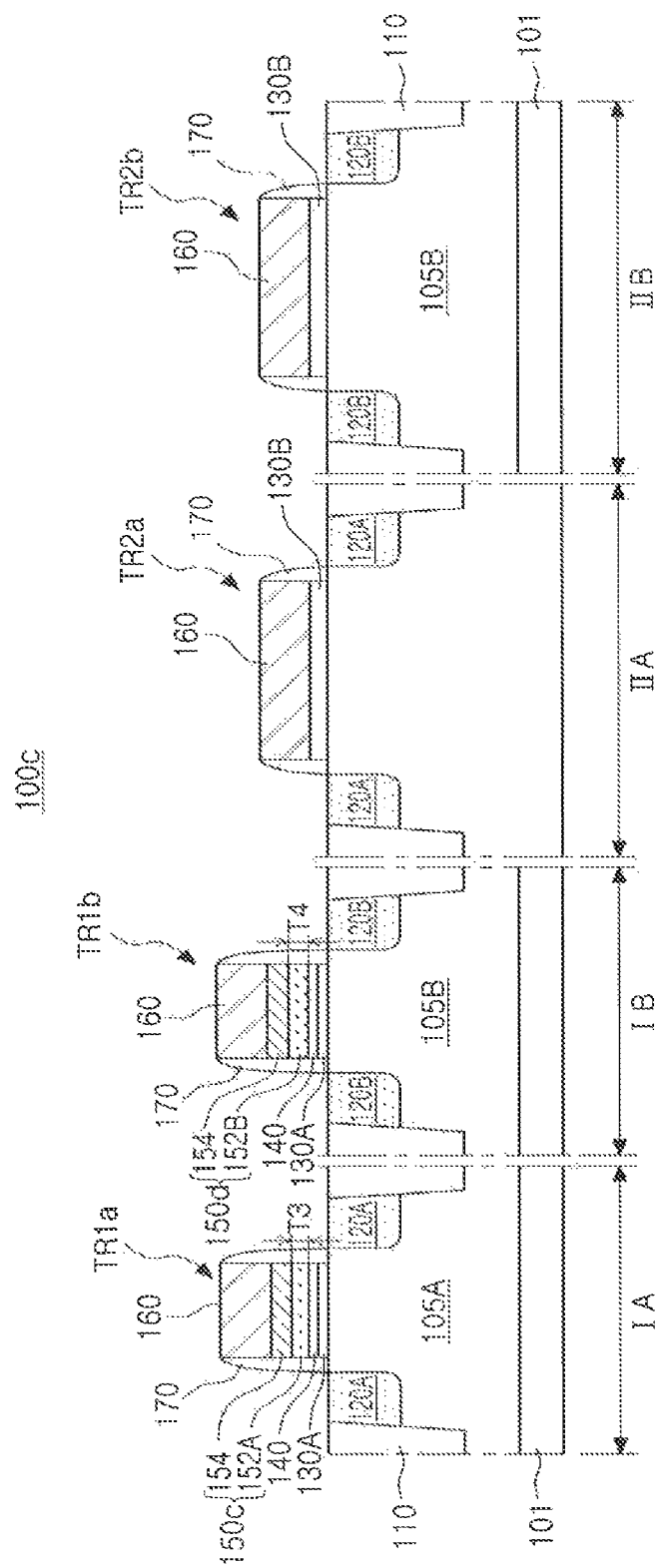
Figure 7:
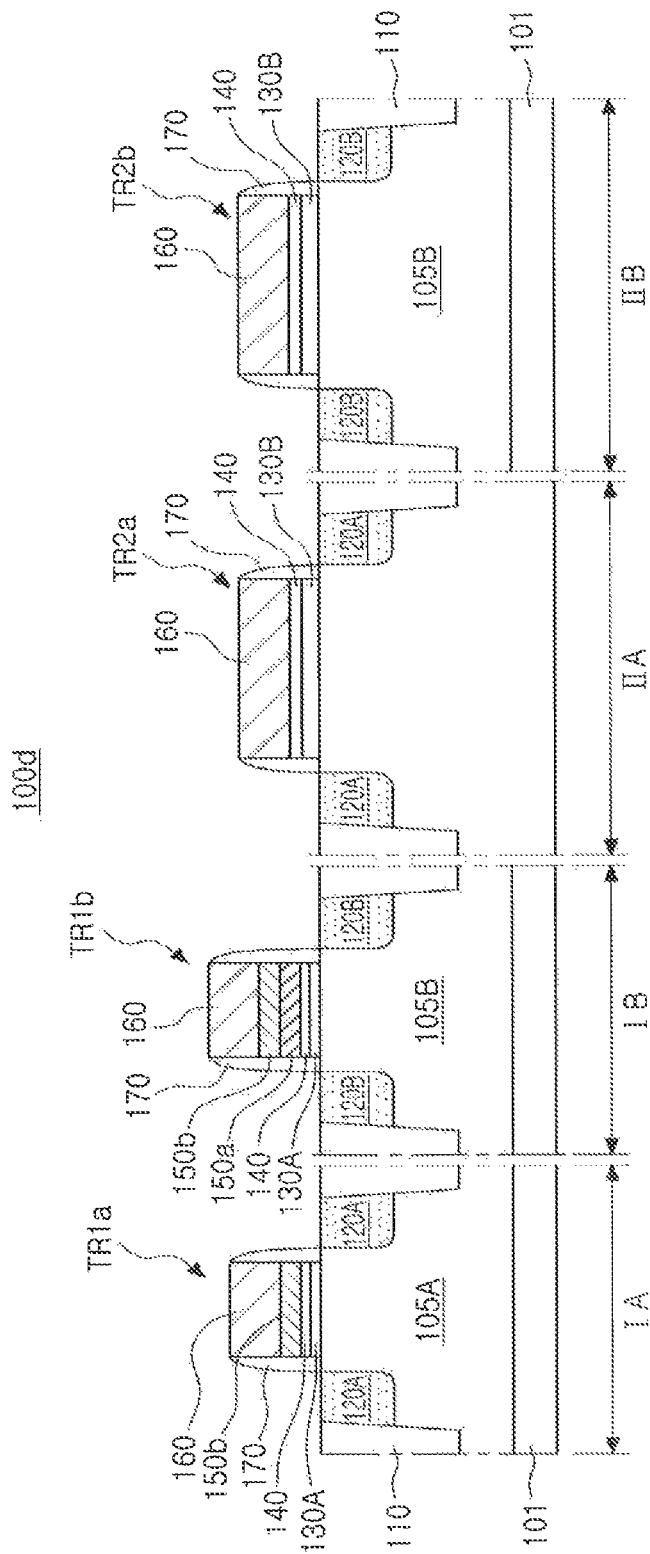

FIGS. 5 to 7 are schematic cross-sectional views of a semiconductor device according to example embodiments.

Referring to FIG. 5, a second transistor TR1*b* of a semiconductor device 100*b* may only include a second metal layer 150*a* and a second gate electrode layer 160 as a gate electrode layer, in a manner different from the example embodiment of FIG. 4. Thus, a gate stack of the second transistor TR1*b* may include a second gate dielectric layer 130A, a first gate dielectric layer 140, the second metal layer 150*a*, and the second gate electrode layer 160 sequentially stacked on a substrate 101.

With reference to FIG. 6, first and second transistors TR1*a* and TR1*b* of a semiconductor device 100*c* may include first gate electrode layers 150*c* and 150*d* including first and second conductive layers 152A, 152B and 154.

The first and second conductive layers 152A, 152B and 154 may be metal layers having different work functions. A thickness T3 of the first conductive layer 152A of the first transistor TR1*a* may be less than a thickness T4 of the first conductive layer 152B of the second transistor TR1*b*. The first conductive layers 152A and 152B may include a p-type metal, and the second conductive layers 154 may include an n-type metal, but are not limited thereto. In the case of the first and second transistors TR1*a* and TR1*b*, as the thicknesses of the first and second conductive layers 152A, 152B and 154 are adjusted to be different from each other, while having a stack of the same types of first gate electrode layers 150*c* and 150*d*, a transistor having a required threshold voltage may be implemented.

Referring to FIG. 7, third and fourth transistors TR2*a* and TR2*b* of a semiconductor device 100*d* may include a second gate dielectric layer 130B as a gate dielectric layer, and may further include a first gate dielectric layer 140 stacked on the second gate dielectric layer 130B. Thus, gate stacks of the third and fourth transistors TR2a and TR2b may respectively include the second gate dielectric layer 130B, the first gate dielectric layer 140 and a second gate electrode layer 160 sequentially stacked on a substrate 101.

A thickness of the second gate dielectric layer 130B may be greater than a thickness of a second gate dielectric layer 130A of each of first and second transistors TR1a and TR1b, but is not limited thereto. In example embodiments, the thickness of the second gate dielectric layer 130B may be the same as the thickness of the second gate dielectric layer 130A of each of the first and second transistors TR1a and TR1b, and a thickness of the first gate dielectric layer 140 of each of the third and fourth transistors TR2a and TR2b may also be the same as that of a first gate dielectric layer 140 of each of the first and second transistors TR1a and TR1b.

FIGS. 8A to 8H are schematic cross-sectional views illustrating a method of manufacturing a semiconductor device according to example embodiments.

Figure 8A:
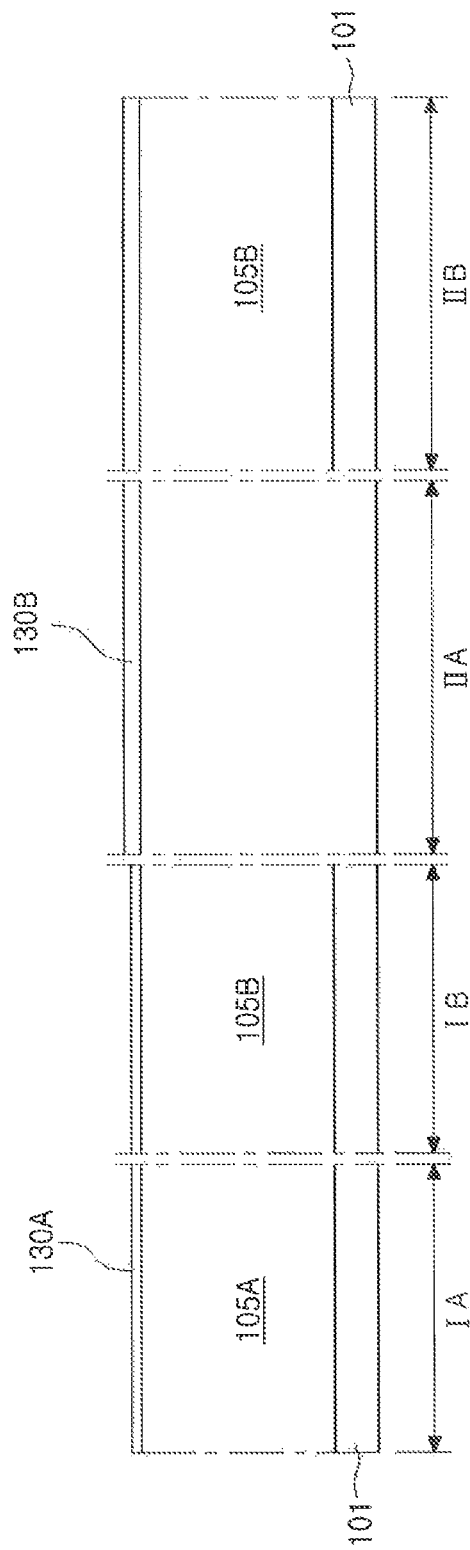

Referring to FIG. 8A, a substrate 101 including first to fourth regions IA, IB, IIA and IIB may be provided, first and second well regions 105A and 105B may be formed in the substrate 101, and second gate dielectric layers 130A and 130B may be formed.

The first and second well regions 105A and 105B may be formed by forming a mask layer and implanting impurities using an ion implantation process. A mask layer exposing the first region IA may be formed, and p-type impurities may be implanted to form the first well region 105A, and a mask layer exposing the second and fourth regions IB and IIB may be formed, and n-type impurities may be implanted to form the second well regions 105B. In the first and third regions IA and IIA, in a lower region of the first well region 105A and a region having a depth corresponding to that of the lower region of the first well region 105A, a deep well region including impurities of a conductivity type different from that of the first well region 105A may further be formed.

The second gate dielectric layers 130A and 130B may be formed using an oxidation process, for example, a thermal oxidation process. At first, the entirety or a portion of the second gate dielectric layer 130B is formed for the third and fourth regions IIA and IIB, and then the second gate dielectric layer 130A may be formed after removing the second gate dielectric layer 130B from the first and second regions IA and IB. In this case, the second gate dielectric layer 130A may be formed by performing an oxidation process with respect to the entirety of the first to fourth regions IA, IB, IIA and IIB, or may be formed by performing an oxidation process only with respect to the first and second regions IA and IB. Thus, the second gate dielectric layers 130A and 130B may be formed to have different thicknesses in the first and second regions IA and IB and the third and fourth regions IIA and IIB.

Figure 8B:
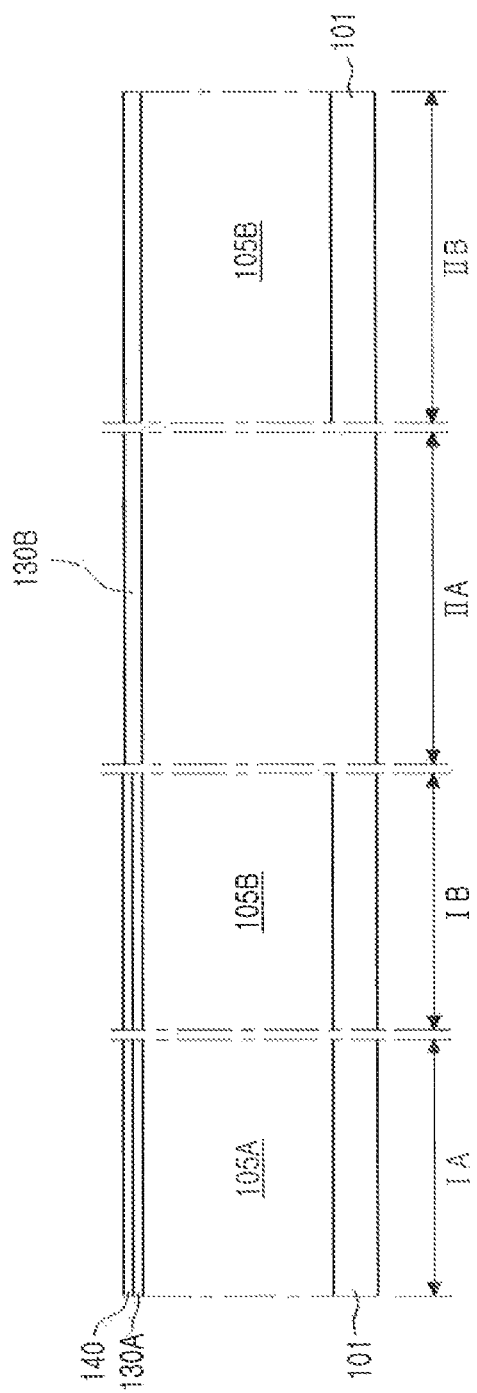

Referring to FIG. 8B, a first gate dielectric layer 140 may be formed in the first and second regions IA and IB. The first gate dielectric layer 140 may be formed on the second gate dielectric layer 130A to be in contact therewith.

The first gate dielectric layer 140 may be a high dielectric material layer, and may be formed using, for example, atomic layer deposition (ALD) or chemical vapor deposition (CVD). By forming the first gate dielectric layer 140 in an overall region and then removing the first gate dielectric layer 140 from the third and fourth regions IIA and IIB, the first gate dielectric layer 140 may only be formed in the first and second regions IA and IB. Alternatively, a mask layer may be formed on the third and fourth regions IIA and IIB, and then a deposition process may be performed, and the mask layer may be removed, thereby forming the first gate dielectric layer 140 only in the first and second regions IA and IB. In the case of the example embodiment described above with reference to FIG. 7, at this stage, the first gate dielectric layer 140 may be formed in the overall region, thereby forming the first gate dielectric layer 140.

Referring to FIG. 8C, a second metal layer 150a may be formed in the second region IB. The second metal layer 150a may be formed on the first gate dielectric layer 140 to be in contact therewith, in the second region IB.

The second metal layer 150a may be formed using ALD, CVD, or physical vapor deposition (PVD). After forming the second metal layer 150a in an overall region, as the second metal layer 150a is removed from the first, third and fourth regions IA, IIA and IIB, the second metal layer 150a may only be formed in the second region IB.

Figure 8D:
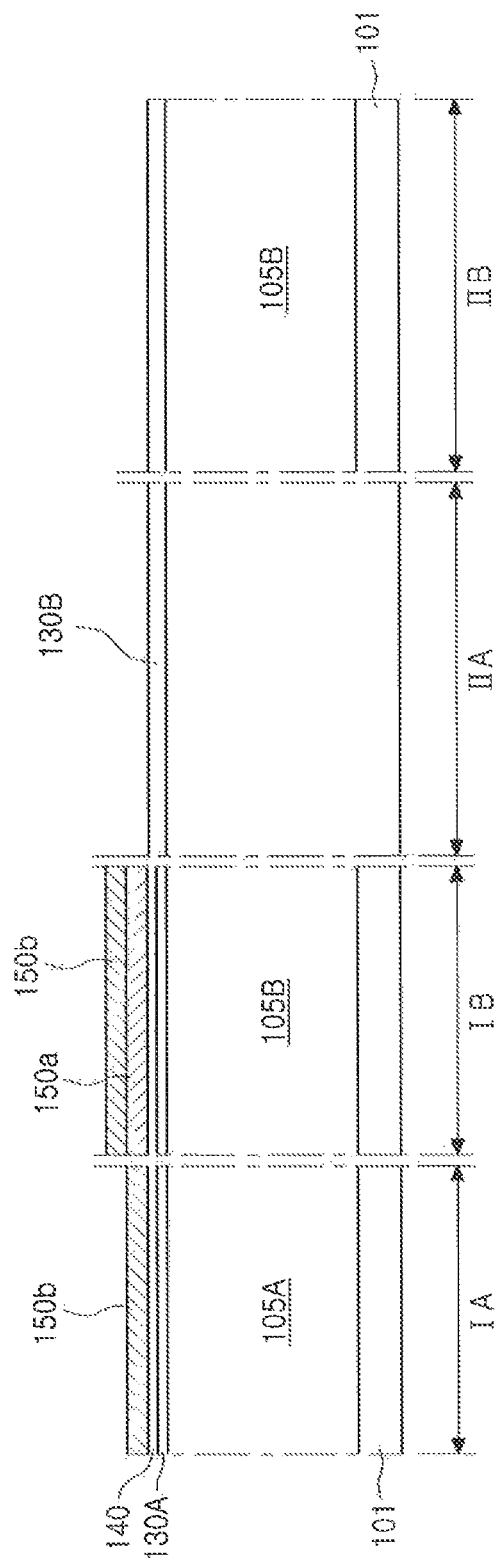

Referring to FIG. 8D, a first metal layer 150b may be formed in the first and second regions IA and IB. The first metal layer 150b may be formed on the first gate dielectric layer 140 to be in contact with the first gate dielectric layer 140 in the first region IA, and the first metal layer 150b may be formed on the second metal layer 150a to be in contact with the second metal layer 150a in the second region IB.

The first metal layer 150b may be formed in a similar manner to the second metal layer 150a, or may be formed using ALD, CVD, or PVD. At this stage, in the case of the example embodiment described above with reference to FIG. 5, the first metal layer 150b may only be formed in the first region IA.

Figure 8E:
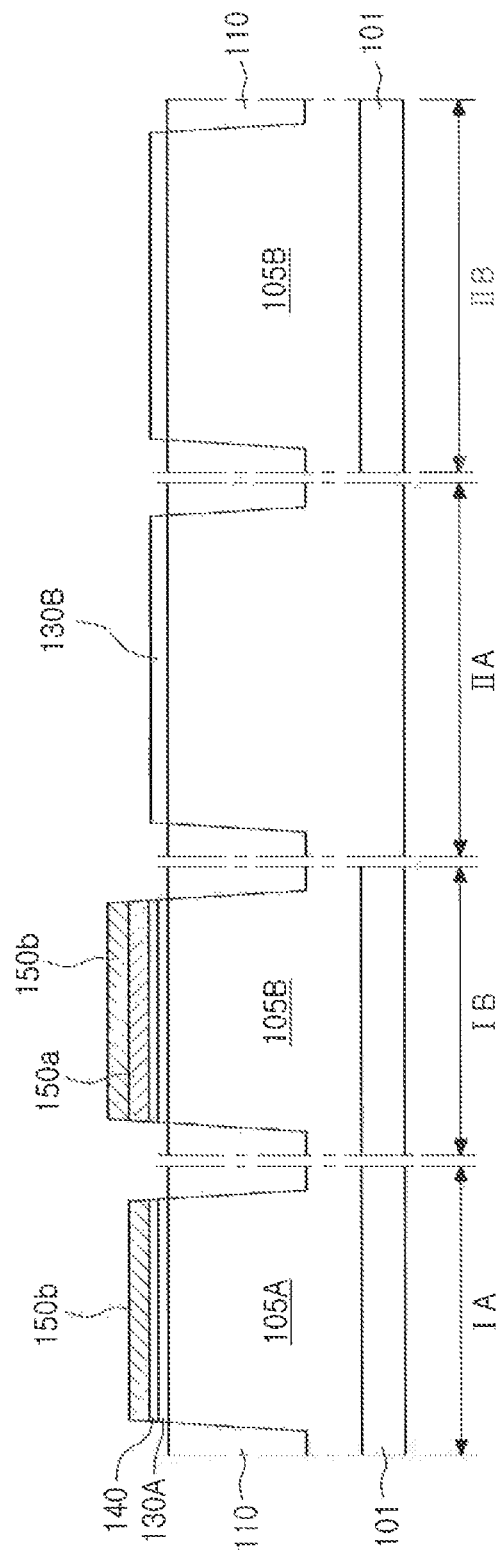

Referring to FIG. 8E, device isolation regions 110 may be formed in an overall region.

The device isolation regions 110 may be formed by removing a portion of the substrate 101 to form trenches and by filling the trenches with an insulating material, using an STI process. Only an internal portion of the trenches may be filled with the insulating material using a chemical mechanical polishing (CMP) process, and to this end, a separate CMP stopper layer may also be formed. In example embodiments, device isolation regions 110 of the third and fourth regions IIA and IIB, high voltage regions in which high voltage transistors are disposed, may be formed to be deeper than device isolation regions 110 of the first and second regions IA and IB, low voltage regions.

In example embodiments, this process may also be performed in other process stages. For example, device isolation regions 110 may be formed after the second gate dielectric layers 130A and 130B are formed or after the first gate dielectric layer 140 is formed.

Figure 8F:
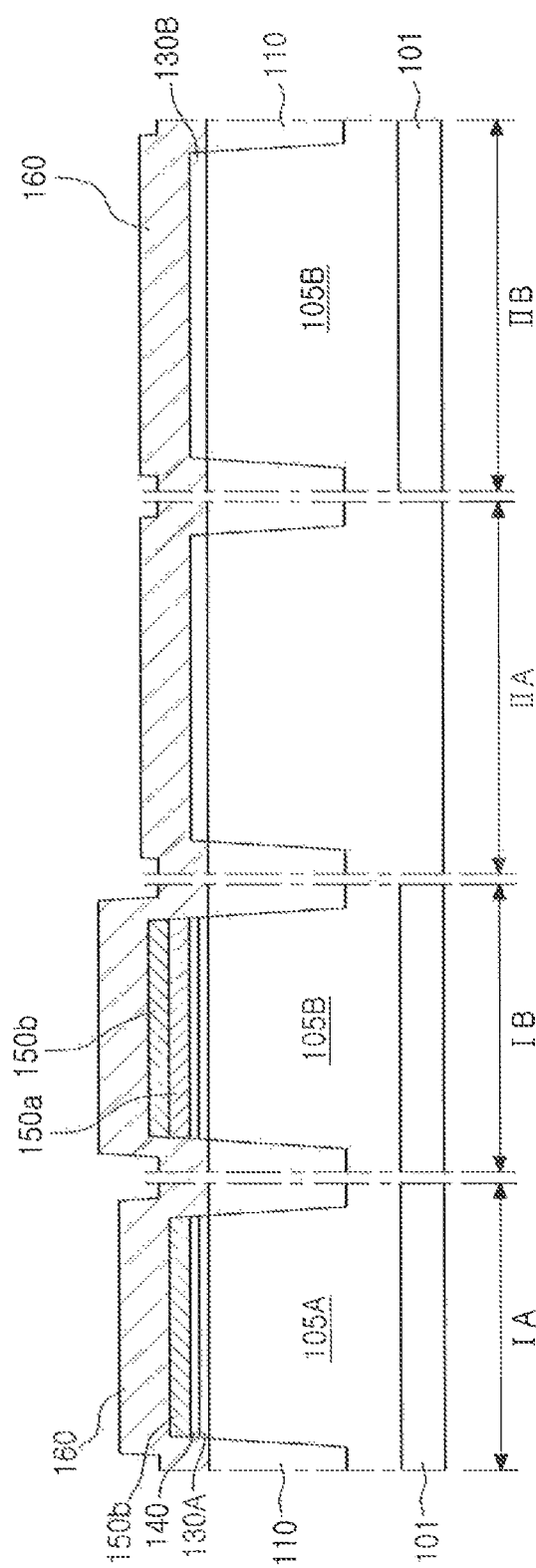

Referring to FIG. 8F, the second gate electrode layer 160 may be formed in an overall region. The second gate electrode layer 160 may be formed on the first metal layer 150b to be in contact with the first metal layer 150b in the first and second regions IA and IB, and may be formed on the second gate dielectric layer 130B to be in contact with the second gate dielectric layer 130B in the third and fourth regions IIA and IIB.

The second gate electrode layer 160 may be formed using, for example, CVD.

Figure 8G:
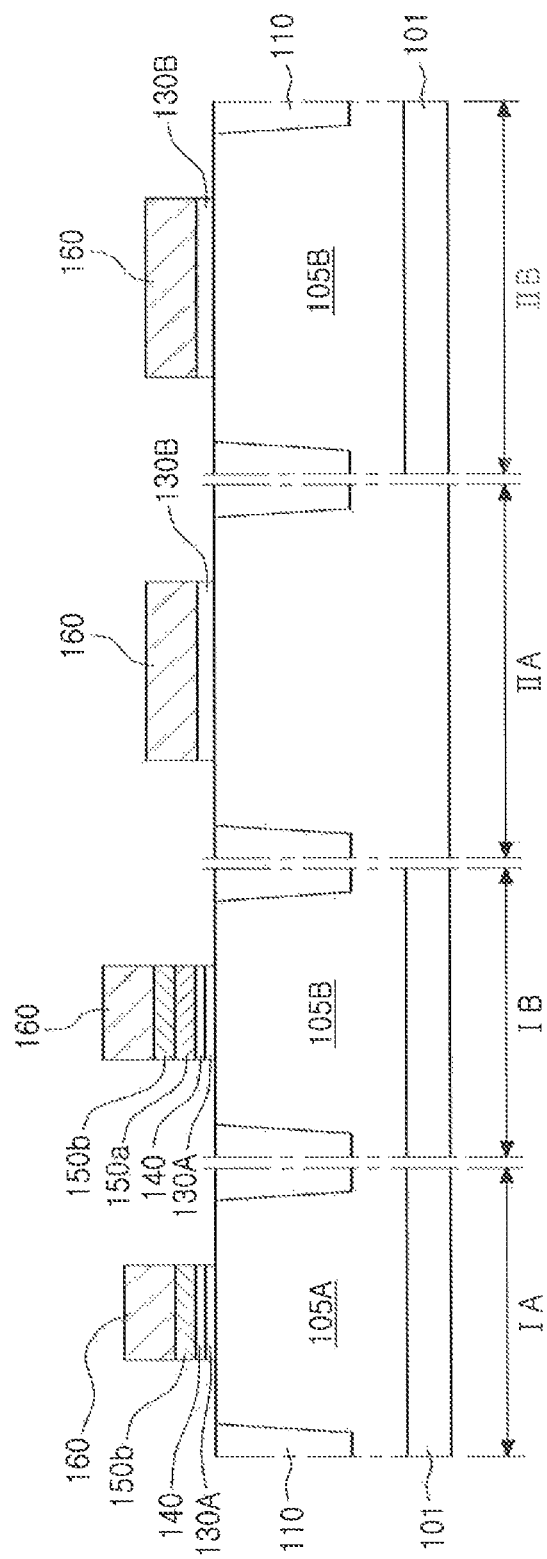

With reference to FIG. 8G, gate stacks may be formed by etching stack structures of the second gate dielectric layers 130A and 130B, the first gate dielectric layers 140, the first metal layers 150b, the second metal layer 150a, and the second gate electrode layer 160 in the overall region.

After a mask layer is formed, exposed stack structures may be removed by dry etching to form gate stacks in respective regions.

Figure 8H:
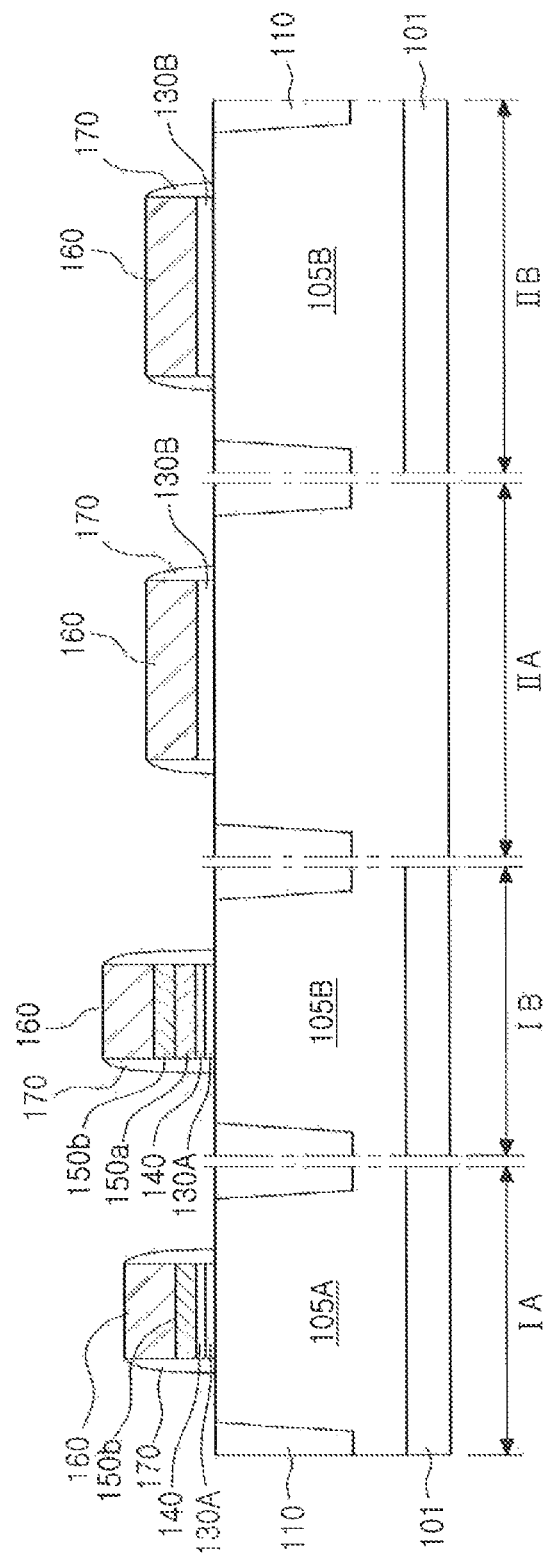

Referring to FIG. 8H, spacers 170 may be formed on sidewalls of the gate stacks.

The spacers 170 may be formed by depositing an insulating material and then removing portions of the insulating material to remain only on the sidewalls of the gate stacks using anisotropic etching.

Subsequently, referring to FIG. 8H together with FIG. 4, source/drain regions 120A and 120B may be formed by implanting impurities into the substrate 101 on both sides of the spacers 170 using an ion implantation process, thereby manufacturing the semiconductor device 100a of FIG. 4.

Figure 9A:
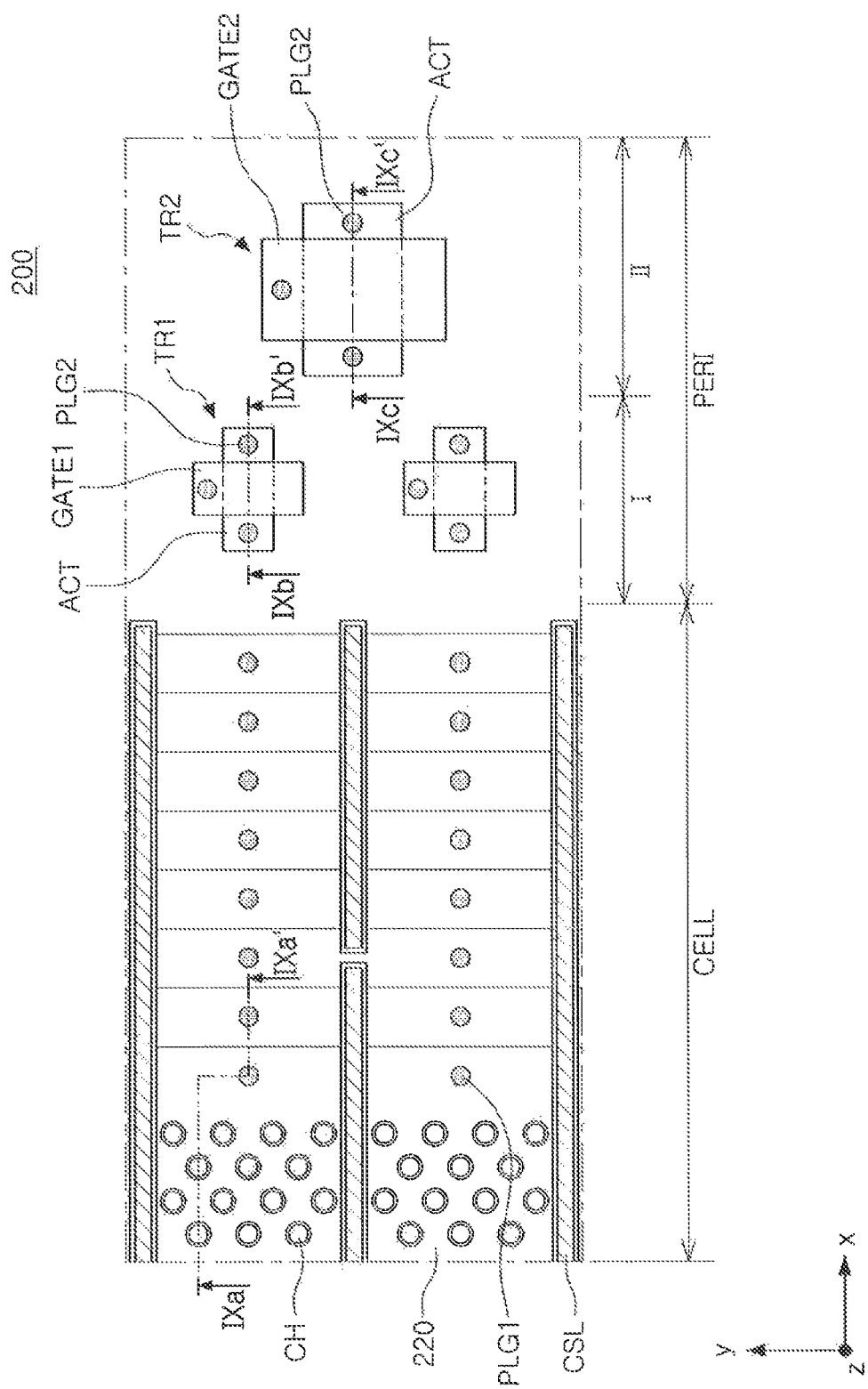
FIGS. 9A and 9B are a schematic plan view and a cross-sectional view of a semiconductor device according to example embodiments.
Figure 9B:
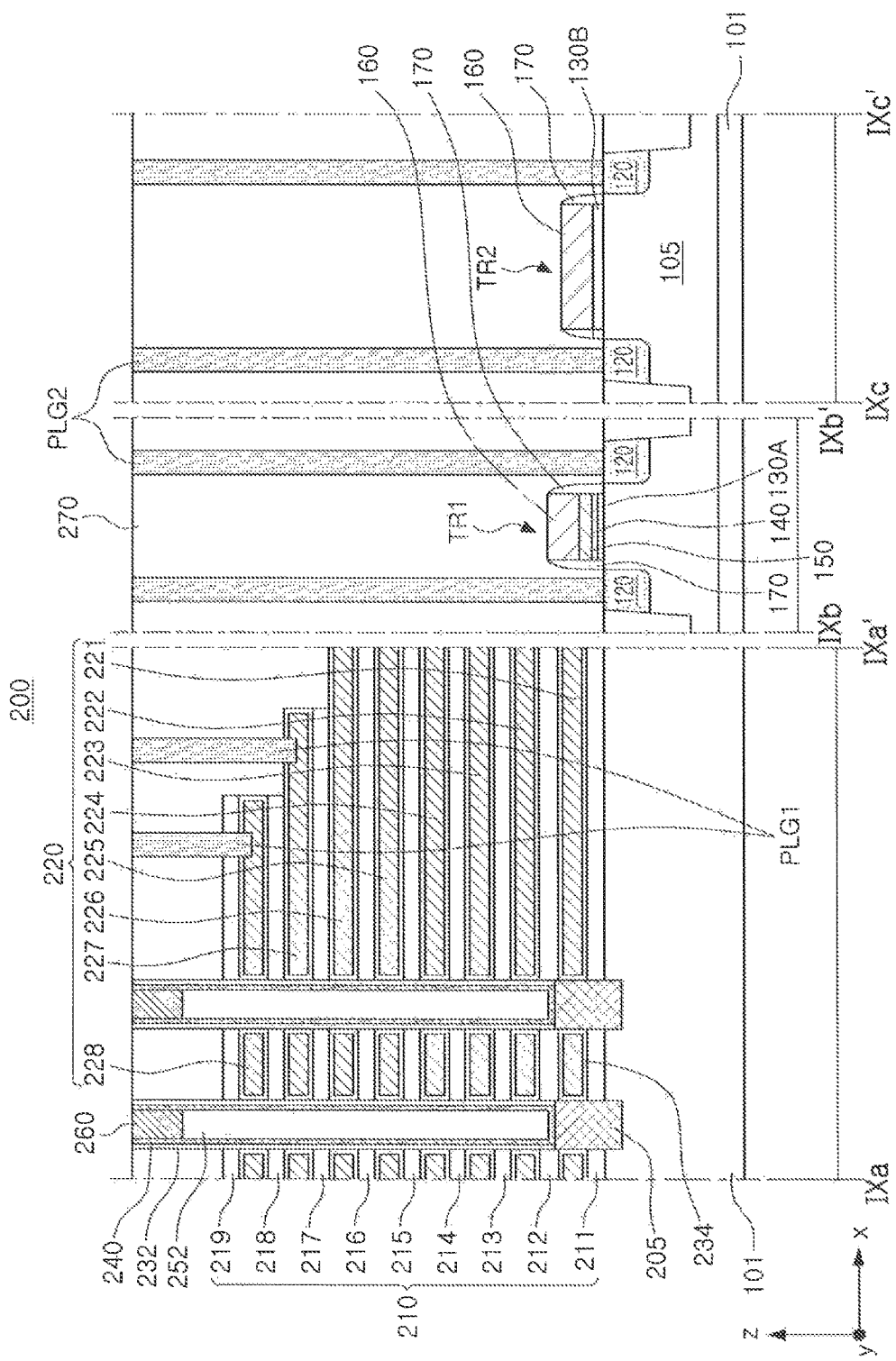

FIGS. 9A and 9B are a schematic plan view and a cross-sectional view of a semiconductor device according to example embodiments. In a plan view of FIG. 9A, only the layout of main components is illustrated for the sake of understanding. FIG. 9B illustrates cross sections taken along lines IXa-IXa' IXb-IXb' and IXc-IXc' of FIG. 9A.

With reference to FIGS. 9A and 9B, a semiconductor device 200 may include a memory cell region CELL and a peripheral circuit region PERI.

The memory cell region CELL may include channel holes CH extending in a direction perpendicular to an upper surface of the substrate 101 and having channel regions 240 disposed therein, a plurality of interlayer insulating layers 211 to 219 (interlayer insulating layers 210) and a plurality of cell gate electrodes 221 to 228 (cell gate electrodes 220), stacked along outer sidewalls of the channel holes CH. The memory cell region CELL may further include first and second cell gate dielectric layers 232 and 234 disposed between the channel region 240 and the cell gate electrodes 220, epitaxial layers 205 disposed below the channel regions 240, channel pads 260 disposed on upper ends of the channel holes CH, and a common source line CSL.

The channel holes CH may be arranged on the substrate 101 to be spaced apart from each other in rows and columns. Although in the channel holes CH, the channel region 240 may be formed to have an annular shape surrounding an inner channel insulating layer 252, the channel region 240 may have a pillar shape without the channel insulating layer 252 therein according to an example embodiment. The cell gate electrodes 220 may respectively form a gate of a ground selection transistor and a plurality of memory cells and string selection transistors, and the number of cell gate electrodes 220 may be determined according to a capacity of the semiconductor device 200. The cell gate electrodes 220 may include a metal, for example, tungsten (W), but are not limited thereto.

The first cell gate dielectric layer 232 may be disposed in the channel hole CH, to be provided between the cell gate electrodes 220 and the channel region 240, and the second cell gate dielectric layer 234 may be disposed to extend along the cell gate electrodes 220 to be parallel to the cell substrate 101. The first cell gate dielectric layer 232 may include a tunneling layer and a charge storage layer sequentially stacked from the channel region 240. The tunneling layer may include, for example, a layer of the same material as that of the second gate dielectric layers 130A and 130B of the peripheral circuit region PERI. The charge storage layer may be a charge trapping layer or a floating gate conductive layer. The second cell gate dielectric layer 234 may include a blocking layer, and may include a layer of the same material as the first gate dielectric layer 140 of the peripheral circuit region PERI.

The plurality of cell gate electrodes 220 may extend to have different lengths while forming a stepped shape in one side of the memory cell region CELL, and may be connected to word line plugs PLG1.

The peripheral circuit region PERI may include a first region I in which a low voltage transistor is disposed, and a second region II in which a high voltage transistor is disposed. First and second transistors TR1 and TR2 including an active region ACT and gate stacks GATE1 and GATE2 may be disposed in the peripheral circuit region PERI. Descriptions of the first and second transistors TR1 and TR2 may be applied identically to the description above with reference to FIGS. 3 to 7. The peripheral circuit region PERI may further include circuit plugs PLG2 connected to the active region ACT and the gate stacks GATE1 and GATE2.

The semiconductor device 200 may be manufactured by first forming the peripheral circuit region PERI and then forming the memory cell region CELL, while the word line plugs PLG1 and the circuit plugs PLG2 may be formed together in a single process.

Figure 10:
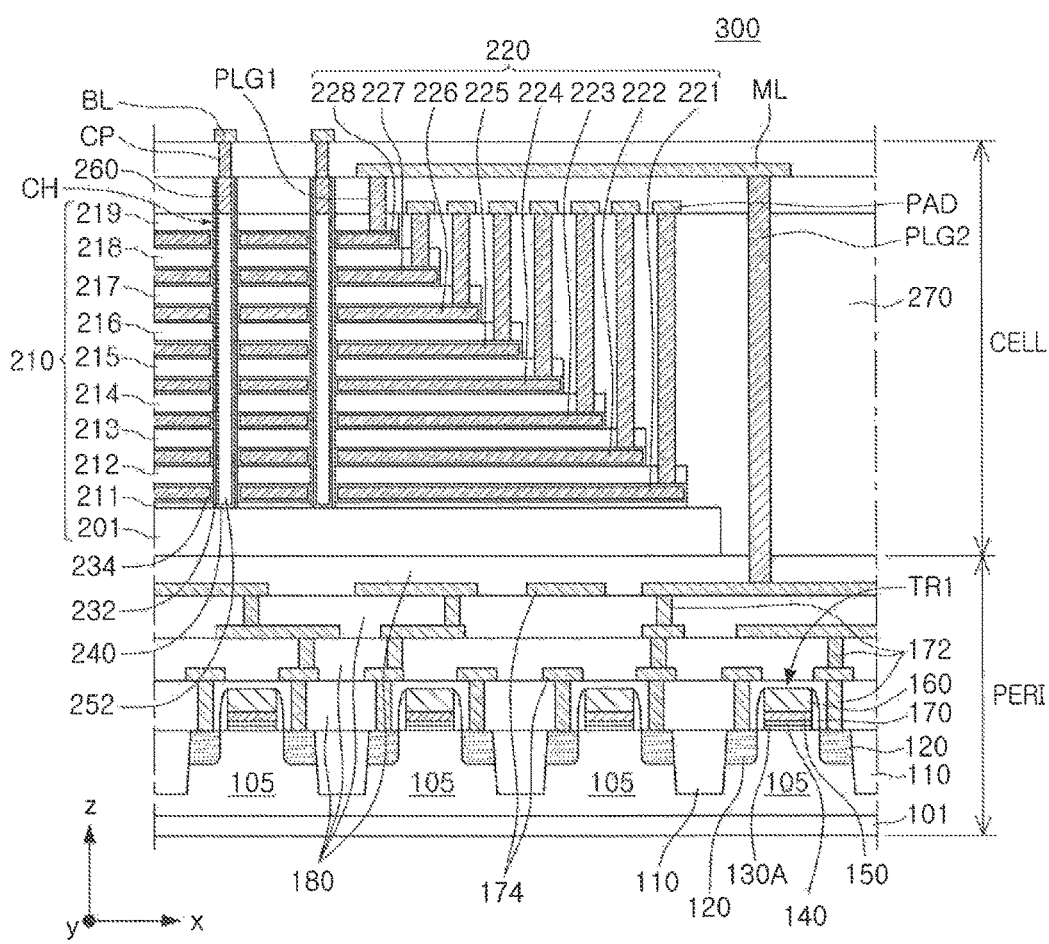
FIG. 10 is a schematic cross-sectional view of a semiconductor device according to example embodiments.

FIG. 10 is a schematic cross-sectional view of a semiconductor device according to example embodiments.

Referring to FIG. 10, a semiconductor device 300 may include a memory cell region CELL and a peripheral circuit region PERI. The memory cell region CELL may be disposed on top of the peripheral circuit region PERI, in example embodiments, the memory cell region CELL may also be disposed on a lower end of the peripheral circuit region PERI.

The memory cell region CELL may include a cell substrate 201, channel holes CH extending in a direction perpendicular to an upper surface of the cell substrate 201, a plurality of interlayer insulating layers 210 and a plurality of cell gate electrodes 220, in a manner similar to the description provided above with reference to FIG. 9B. The memory cell region CELL may further include contact plugs CP and bit lines BL connected to the channel pads 260, and pads PAD and a metal line ML connected to the word line plugs PLG1.

The peripheral circuit region PERI may include a plurality of first transistors TR1, and may also include the second transistors TR2 described above with reference to FIGS. 3 to 7, disposed in a region not illustrated in the drawing. The peripheral circuit region PERI may further include circuit insulating layers 180 above the first transistors TR1, and vertical and horizontal wiring lines 172 and 174 disposed within the circuit insulating layers 180 and electrically connected to the first transistors TR1. Cell gate electrodes 220 of the memory cell region CELL may be connected to the first transistor TR1 of the peripheral circuit region PERI through the metal line ML and the circuit plug PLG2.

In the case of the semiconductor device 300, after the peripheral circuit region PERI is first fabricated, the cell substrate 201 of the cell region CELL may be formed thereon to form the memory cell region CELL. The cell substrate 201 may have the same size as the substrate 101, or may be formed to be smaller than the substrate 101.

As set forth above, according to example embodiments, by employing different gate stack structures of transistors disposed in a peripheral circuit region of a semiconductor device, a semiconductor device having increased integration and secured reliability may be provided.

While example embodiments have been shown and described above, it will be apparent to those skilled in the art that modifications and variations could be made without departing from the scope of the present disclosure as defined by the appended claims.

What is claimed is:
1. A semiconductor device comprising:
  a memory cell region including memory cells arranged along channel holes, the channel holes being provided on a substrate to extend in a direction perpendicular to an upper surface of the substrate; and a peripheral circuit region disposed outside of the memory cell region, and including low voltage transistors and high voltage transistors, wherein the low voltage transistors include first transistors including a first gate dielectric layer and a first gate electrode layer including a metal, and the high voltage transistors include second transistors including a second gate dielectric layer having a dielectric constant lower than a dielectric constant of the first gate dielectric layer, and a second gate electrode layer including polysilicon, wherein the low voltage transistors have a channel length shorter than a channel length of the high voltage transistors.

2. The semiconductor device of claim 1, wherein the first gate dielectric layer and the first gate electrode layer are disposed in direct contact with each other, and the second gate dielectric layer and the second gate electrode layer are disposed in direct contact with each other.

3. The semiconductor device of claim 1, wherein the first transistors further comprise the second gate dielectric layer disposed below the first gate dielectric layer.

4. The semiconductor device of claim 3, wherein a thickness of the second gate dielectric layer in the second transistors is greater than a thickness of the second gate dielectric layer in the first transistors.

5. The semiconductor device of claim 1, wherein the first transistors comprise n-type transistors and p-type transistors, the first gate electrode layer of the n-type transistors comprises a first metal layer, and the first gate electrode layer of the p-type transistors comprises a second metal layer having a work function higher than a work function of the first metal layer.

6. The semiconductor device of claim 5, wherein the first gate electrode layer of the p-type transistors further comprises the first metal layer.

7. The semiconductor device of claim 1, wherein the first transistors comprise n-type transistors and p-type transistors, the first gate electrode layer comprises a first conductive layer and a second conductive layer, and a thickness of at least one of the first conductive layer and the second conductive layer is different in the n-type transistors and the p-type transistors.

8. The semiconductor device of claim 1, wherein the first transistors further comprise the second gate electrode layer stacked on the first gate electrode layer.

9. The semiconductor device of claim 1, wherein the first transistors generate an electrical signal required for communications between the memory cells and an external host, and the second transistors generate an electrical signal required for operations of the memory cells.

10. The semiconductor device of claim 9, wherein the first transistors are included in an input/output circuit.

11. The semiconductor device of claim 1, wherein the low voltage transistors have an operating voltage of 1 V to 5 V, and the high voltage transistors have an operating voltage of 10 V to 40 V.

12. The semiconductor device of claim 1, wherein the memory cells comprise:

a channel region disposed in the channel holes;

a cell gate dielectric layer including a tunneling layer, a charge storage layer, and a blocking layer sequentially disposed on the channel region; and a cell gate electrode layer surrounding the channel holes.

13. The semiconductor device of claim 12, wherein the cell gate electrode layer comprises a metal.

14. The semiconductor device of claim 12, wherein the blocking layer comprises a same material as a material of the first gate dielectric layer.

15. A semiconductor device comprising:

a memory cell region including memory cells arranged along channel holes, the channel holes being provided on a substrate to extend in a direction perpendicular to an upper surface of the substrate; and a peripheral circuit region disposed outside of the memory cell region, and including first transistors generating an electrical signal required for communications between the memory cells and an external host and second transistors generating an electrical signal required for operations of the memory cells and, wherein the first transistors include a first gate dielectric layer and first gate electrode layer including a first metal layer and a second metal layer, and the second transistors include a second gate dielectric layer having a dielectric constant lower than a dielectric constant of the first gate dielectric layer.

16. The semiconductor device of claim 15, wherein the first gate electrode layer includes a metal, and the second transistors comprise a second gate electrode layer including polysilicon.

17. The semiconductor device of claim 15, wherein the first gate dielectric layer comprises a high-k material having a dielectric constant higher than a dielectric constant of silicon dioxide ($SiO_2$).

18. A semiconductor device comprising:

a memory cell region including memory cells including a charge storage layer; and a peripheral circuit region disposed outside of the memory cell region, and including first transistors including a first gate dielectric layer including a high-k material and a first gate electrode layer, and second transistors including a second gate dielectric layer including silicon dioxide ($SiO_2$) and a second gate electrode layer including polysilicon, wherein the first transistors comprise n-type transistors and p-type transistors, the first gate electrode layer of the n-type transistors comprises a first metal layer, and the first gate electrode layer of the p-type transistors comprises a second metal layer, wherein the first metal layer is different from the second metal layer.

19. The semiconductor device of claim 18, wherein the first transistors and the second transistors have different operating voltage ranges.

* * * * *